(12) United States Patent
Fujikawa et al.

(10) Patent No.: US 11,927,884 B2
(45) Date of Patent: Mar. 12, 2024

(54) RESIN MOLDED ARTICLE PRODUCTION METHOD AND OPTICAL COMPONENT PRODUCTION METHOD

(71) Applicant: DAICEL CORPORATION, Osaka (JP)

(72) Inventors: Takeshi Fujikawa, Himeji (JP); Sadayuki Fukui, Himeji (JP)

(73) Assignee: DAICEL CORPORATION, Osaka (JP)

( * ) Notice: Subject to any disclaimer, the term of this patent is extended or adjusted under 35 U.S.C. 154(b) by 724 days.

(21) Appl. No.: 16/498,304

(22) PCT Filed: Feb. 8, 2018

(86) PCT No.: PCT/JP2018/004330
§ 371 (c)(1),
(2) Date: Sep. 26, 2019

(87) PCT Pub. No.: WO2018/179881
PCT Pub. Date: Oct. 4, 2018

(65) Prior Publication Data
US 2020/0039136 A1    Feb. 6, 2020

(30) Foreign Application Priority Data

Mar. 27, 2017  (JP) ................................ 2017-061867
Mar. 27, 2017  (JP) ................................ 2017-061868
(Continued)

(51) Int. Cl.
*G03F 7/00* (2006.01)
*B05D 3/14* (2006.01)
(Continued)

(52) U.S. Cl.
CPC ............. *G03F 7/0002* (2013.01); *B05D 3/14* (2013.01); *B29C 37/006* (2013.01);
(Continued)

(58) Field of Classification Search
None
See application file for complete search history.

(56) References Cited

U.S. PATENT DOCUMENTS 8,480,933 B2    7/2013  Truskett et al.
2008/0233280 A1  9/2008  Blanchet et al.
(Continued)

FOREIGN PATENT DOCUMENTS

CN    101627337 A    1/2010
CN    101837951 A    9/2010
(Continued)

OTHER PUBLICATIONS

Translation of JP 2010-1419 A, Jun. 23, 2008 (Year: 2008).*
(Continued)

*Primary Examiner* — Benjamin A Schiffman
(74) *Attorney, Agent, or Firm* — Birch, Stewart, Kolasch & Birch, LLP

(57) ABSTRACT

The present invention provides a method for producing a resin molded article through which air bubbles are not easily formed during imprint molding when a curable composition is applied to a mold having a pattern shaped section. The method for producing a resin molded article is a method for producing a resin molded article through imprint molding, the method including: a specific curable composition application process such as the curable composition application process (1) below, in which a curable composition having a contact angle of 50° or less on a mold having a pattern shaped section is applied to a portion of the mold uncoated with the curable composition; and a curing process in which
(Continued)

the curable composition applied to the mold is cured to obtain a resin molded article; (1) a curable composition application process including a microparticle application step in which the curable composition is applied such that a particle size of microparticles of the curable composition when adhering to the mold is 0.5 mm or less.

18 Claims, 4 Drawing Sheets

(30) Foreign Application Priority Data

Mar. 27, 2017 (JP) .................................. 2017-061869
Mar. 27, 2017 (JP) .................................. 2017-061870

(51) Int. Cl.
  *B29C 37/00* (2006.01)
  *B29C 41/00* (2006.01)
  *B29C 41/08* (2006.01)
  *B29C 59/00* (2006.01)
  *B29C 59/02* (2006.01)
  *B29C 59/10* (2006.01)
  *B29C 59/14* (2006.01)
  *G02B 3/08* (2006.01)
  *B29K 63/00* (2006.01)
  *B29L 11/00* (2006.01)
  *G02B 1/04* (2006.01)

(52) U.S. Cl.
  CPC ............ *B29C 41/006* (2013.01); *B29C 41/08* (2013.01); *B29C 59/002* (2013.01); *B29C 59/022* (2013.01); *B29C 59/10* (2013.01); *B29C 59/14* (2013.01); *G02B 3/08* (2013.01); *B29C 2059/023* (2013.01); *B29K 2063/00* (2013.01); *B29L 2011/005* (2013.01); *G02B 1/041* (2013.01)

(56) References Cited

U.S. PATENT DOCUMENTS

| 2010/0098848 | A1 | 4/2010 | Truskett et al. |
| 2010/0302654 | A1* | 12/2010 | Amano ................... G02B 3/08 |
| | | | 359/742 |
| 2016/0123552 | A1* | 5/2016 | Okuno ................... G02B 3/005 |
| | | | 362/330 |
| 2016/0311968 | A1* | 10/2016 | Fujikawa ......... B29D 11/00269 |
| 2020/0174164 | A1* | 6/2020 | Fujikawa ................ C08L 63/00 |

FOREIGN PATENT DOCUMENTS

| JP | 2007-73712 A | 3/2007 |
| JP | 2008-33279 A | 2/2008 |
| JP | 2010-1419 A | 1/2010 |
| JP | 2010-266664 A | 11/2010 |
| JP | 2012-506635 A | 3/2012 |
| JP | 2012-121213 A | 6/2012 |
| JP | 2016-129263 A | 7/2016 |
| WO | WO-2015098736 A1 * | 7/2015 ....... B29D 11/00298 |

OTHER PUBLICATIONS

Bailey, Adrian G. "The science and technology of electrostatic powder spraying, transport and coating." Journal of electrostatics 45.2 (Dec. 4, 1998): 85-120. (Year: 1998).*
International Search Report (Form PCT/ISA/210) for International Application No. PCT/JP2018/004330, dated May 1, 2018, with English translation.
Written Opinion of the International Searching Authority (Form PCT/ISN/237) for International Application No. PCT/JP2018/004330, dated May 1, 2018, with English translation.
Chinese Office Action and Search Report for corresponding Chinese Application No. 201880021491.4, dated Mar. 24, 2021.
Extended European Search Report, dated Dec. 15, 2020, for European Application No. 18777493.0.

* cited by examiner (1-a)  (1-b)

RESIN MOLDED ARTICLE PRODUCTION METHOD AND OPTICAL COMPONENT PRODUCTION METHOD

TECHNICAL FIELD

The present invention relates to a method for producing a resin molded article and a method for producing an optical component. More particularly, the present invention relates to a method for producing a resin molded article by imprint molding, and a method for producing an optical component using the resin molded article. The present application claims priority to JP 2017-061867, JP 2017-061868, JP 2017-061869, and JP 2017-061870 filed in Japan on Mar. 27, 2017, the contents of which are incorporated herein.

BACKGROUND ART

In recent years, product value has been increased by equipping mobile electronic devices such as mobile phones and smartphones with sensors and cameras. Furthermore, advances have been made year by year in miniaturization and slimmer designs, and there has been a demand for slimmer, more compact lenses and other such optical components that are used in these electronic devices. While such requirements have traditionally been addressed by producing optical components through injection molding, the limit to achieving slimmer, more compact designs with the injection molding method is being reached. Therefore, attention is now being focused on an imprint molding technique as a new molding method for use in place of the injection molding method (see Patent Document 1).

CITATION LIST

Patent Document

Patent Document 1: JP 2010-266664 A

SUMMARY OF INVENTION

Technical Problem

When a resin molded article having a fine shape is molded through imprint molding, a fine pattern shape (pattern shaped section) corresponding to the fine shape of the resin molded article is provided in the mold that is used. However, the present inventors discovered that for cases in which a resin molded article is molded through imprint molding using a mold having such a fine pattern shaped section, air bubbles (bubbling) are easily formed in the curable composition that forms the resin molded article when the curable composition is applied to the mold. The air bubbles easily form particularly in the vicinity of the bottom of concave portions of the fine pattern shape provided in the mold (the portion that becomes the tip of a convex portion of the resin molded article after molding).

Therefore, an object of the present invention is to provide a method for producing a resin molded article in which air bubbles are not easily formed when a curable composition is applied to a mold having a pattern shaped section during imprint molding, and also a method for producing an optical component using the resin molded article.

Solution to Problem

As a result of diligent research to achieve the object described above, the present inventors discovered that the formation of air bubbles when applying a curable composition onto a mold having a pattern shaped section can be inhibited by (i) micronizing a curable composition of which a contact angle on a mold having a pattern shaped section is small, and coating the mold with the curable composition, (ii) using, as a curable composition that forms a resin molded article, a dielectric curable composition having a small contact angle on the mold, to apply it onto a conductive substrate, and then applying voltage between the conductive substrate and the mold to thereby cause the curable composition applied on the conductive substrate to contact the pattern shaped section of the mold and be applied thereto, and (iii) applying a curable composition having a small contact angle on the mold prior to implementing a wettability improvement treatment, to a portion of the mold uncoated with the curable composition, the mold having a pattern shaped section for which the surface has been subjected to the wettability improvement treatment, or (iv) applying, at a temperature slightly higher than a surface temperature of the mold, a curable composition having a small contact angle on the mold, to a portion of the mold uncoated with the curable composition, the mold having a pattern shaped section, and a surface of the pattern shaped section being heated. The present invention was completed based on these findings.

Namely, an embodiment of the present invention provides a method for producing a resin molded article which is a method for producing a resin molded article through imprint molding, the method including: one or more curable composition application processes from the following (1) to (4) in which a curable composition having a contact angle of 50° or less on a mold having a pattern shaped section is applied to a portion of the mold uncoated with the curable composition; and a curing process in which the curable composition applied to the mold is cured to obtain a resin molded article;

(1) a curable composition application process including a microparticle application step in which the curable composition is applied such that a particle size of microparticles of the curable composition when adhering to the mold is 0.5 mm or less;

(2) a curable composition application process including: a conductive substrate coating step in which a conductive substrate is coated with the curable composition; and a voltage application coating step in which a curable composition coated surface of the conductive substrate and a surface of the mold having the pattern shaped section are arranged so as to face other, and voltage is applied between the conductive substrate and the mold to cause the curable composition applied onto the conductive substrate to contact the portion of the mold uncoated with the curable composition and be applied thereto;

(3) a curable composition application process in which the curable composition is applied to the portion of the mold uncoated with the curable composition, the mold having a pattern shaped section that has been subjected to a wettability improvement treatment on a surface;

(4) a curable composition application process including a heat application step in which the curable composition having a temperature that is 3 to 7° C. higher than a surface temperature of the mold having the pattern shaped section is applied to a portion of the mold that is uncoated with the curable composition and has a surface temperature at the pattern shaped section of from 35 to 55° C.

When the method includes the curable composition application process (1), in the microparticle application step, the curable composition is preferably applied such that an aspect ratio of the microparticles of the curable composition when adhering to the mold is 0.1 or greater.

When the method includes the curable composition application process (1), application in the microparticle application step is preferably implemented by spray coating.

When the method includes the curable composition application process (1), the curable composition application process (1) preferably includes, after the microparticle application step, applying the curable composition to the mold such that the particle size of the curable composition when adhering to the curable composition applied to the mold exceeds 0.1 mm.

When the method includes the curable composition application process (2), the curable composition application process (2) preferably includes, after the voltage application coating step, applying the curable composition to the mold at an application speed of 100 mL/min or greater.

When the method includes the curable composition application process (3), the wettability improvement treatment preferably is one or more treatments selected from the group consisting of a plasma discharge treatment, a corona discharge treatment, an ozone exposure treatment, and an excimer treatment. The plasma discharge treatment or the corona discharge treatment is preferably a discharge treatment with a discharge amount of 50 W·min/m$^2$ or greater.

The method for producing a resin molded article preferably further includes, after one or more of the curable composition application processes of (1) to (4), a mold closing process in which the mold coated with the curable composition, obtained through the one or more of the curable composition application processes of (1) to (4), is superimposed with another mold to which the curable composition was applied through the one or more of the curable composition application processes of (1) to (4), such that the curable compositions are in mutual contact.

The curable composition preferably contains an epoxy compound.

The method for producing a resin molded article preferably includes, after the curable composition application process, a defoaming process through reduced pressure.

Preferably, the pattern shape of the mold is a concavo-convex shape, and a difference in height between a bottommost part of a concave portion and a topmost part of a convex portion is 0.05 mm or greater.

The resin molded article is preferably a microlens array.

An embodiment of the present invention also provides a method for producing an optical component that uses a resin molded article obtained by the method for producing a resin molded article.

Advantageous Effects of Invention

According to the method for producing a resin molded article according to an embodiment of the present invention, it is possible to inhibit the formation of air bubbles when the curable composition is applied to the pattern shaped section of the mold. In particular, even when molds having a fine pattern shaped section are used, air bubbles are not easily formed. Therefore, a resin molded article and an optical component having a fine shape can be easily produced with excellent shape accuracy.

DESCRIPTION OF EMBODIMENTS

Figure 1:
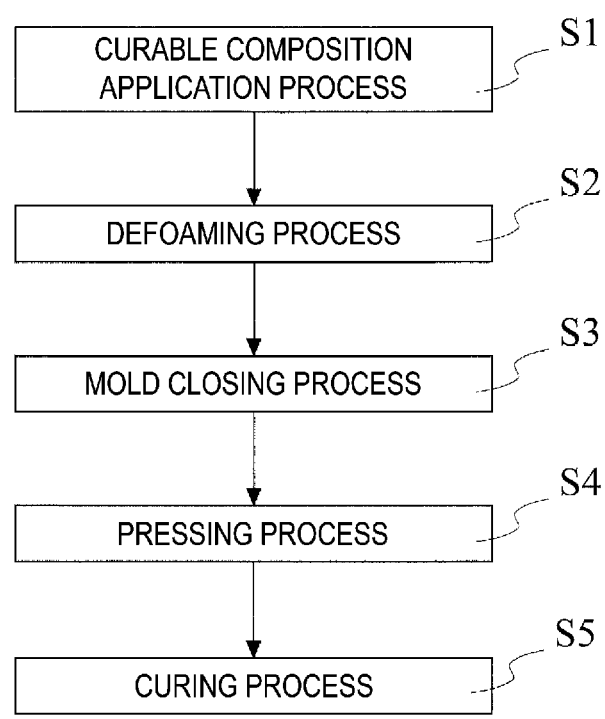
FIG. 1 is a process chart illustrating one embodiment of the method for producing a resin molded article according to an embodiment of the present invention.

The method for producing a resin molded article according to an embodiment of the present invention is a method for producing a resin molded article through imprint molding, the method including: one or more curable composition application processes from the following (1) to (4) in which a curable composition having a contact angle of 50° or less on a mold having a pattern shaped section is applied to a portion of the mold uncoated with the curable composition; and a curing process in which the curable composition applied to the mold is cured to obtain a resin molded article. Note that in the present specification, the method for producing a resin molded article according to an embodiment of the present invention may be referred to simply as "the production method according to an embodiment of the present invention".

(1) A curable composition application process including a microparticle application step in which the curable composition is applied such that a particle size of microparticles of the curable composition when adhering to the mold is 0.5 mm or less;

(2) a curable composition application process including: a conductive substrate coating step in which a conductive substrate is coated with the curable composition; and a voltage application coating step in which a curable composition coated surface of the conductive substrate and a surface of the mold having the pattern shaped section are arranged so as to face each other, and voltage is applied between the conductive substrate and the mold to cause the curable composition applied onto the conductive substrate to contact the portion of the mold uncoated with the curable composition and be applied thereto;

(3) a curable composition application process in which the curable composition is applied to the portion of the mold uncoated with the curable composition, the mold having a pattern shaped section that has been subjected to a wettability improvement treatment on a surface;

(4) a curable composition application process including a heat application step in which the curable composition having a temperature that is 3 to 7° C. higher than a surface temperature of the mold having the pattern shaped section is applied to a portion of the mold that is uncoated with the curable composition and has a surface temperature at the pattern shaped section of from 35 to 55° C.

Note that in the present specification, each of the curable composition application processes of (1) to (4) described above may be referred to as the "curable composition application process (1)" or the like. Also note that the curable composition application processes (1) to (4) may mutually overlap. Furthermore, the production method according to an embodiment of the present invention may include one of the curable composition application processes (1) to (4), or may include two or more of the curable composition application processes.

As described above, the production method according to an embodiment of the present invention is a method for producing a resin molded article through imprint molding, wherein a curable composition that forms a resin molded article is applied to a substrate, another substrate is overlaid so as to sandwich the applied curable composition, and the curable composition is then cured to produce a resin molded article. Note that in the production method according to an embodiment of the present invention, a mold having a pattern shaped section is used as at least one of the substrates, and the curable composition is applied to the pattern shaped section of the mold having the pattern shaped section (hereinafter, the mold may be referred to simply as a "mold").

Specifically, a mold having a desired concavo-convex shape can be used for molding the curable composition, and can be produced, for example, by the methods (I) and (II) below:

(I) a method in which a mold is pressed against a coating film of a curable resin composition applied onto a substrate, the coating film of the curable resin composition is cured, and then the mold is detached;

(II) a method in which a curable composition is applied directly to a mold, a substrate is closely adhered from above, the coating film of the curable composition is cured, and then the mold is detached.

FIG. 1 is a process chart illustrating an embodiment of the production method of the present invention. The production method according to an embodiment of the present invention illustrated in FIG. 1 includes, in the following order, a curable composition application processes S1 of one or more of the curable composition application processes (1) to (4) in which a curable composition having a contact angle of 50° or less on a mold having a pattern shaped section is applied to a portion of the mold uncoated with the curable composition; a defoaming process S2 in which air bubbles in the curable composition that has been applied are removed; a mold closing process S3 in which a mold coated (filled) with the curable composition is superimposed with another substrate so as to sandwich the applied curable coating composition; a pressing process S4 of pressing from an upper portion of an upper mold; and a curing process S5 in which the curable composition applied to the mold is cured to obtain a resin molded article.

Curable Composition Application Process (1)

The curable composition application process (1) includes a step (which may be referred to as a "microparticle application step") in which a curable composition having a contact angle of 50° or less on a mold having a pattern shaped section is applied to a portion of the mold uncoated with the curable composition (namely, a portion that is to be coated with the curable composition forming a resin molded article but is uncoated), such that a particle size of microparticles of the curable composition when adhering to the mold is 0.5 mm or less. Note that, in the present specification, the applying such that the particle size of the microparticles of the curable composition when adhering to the mold is 0.5 mm or less may be referred to as "microparticle application".

That is, in the microparticle application step, when the curable composition is applied to a mold, a curable composition having a contact angle of 50° or less on the mold is used as a curable composition that is first applied to the mold and forms a resin molded article, and the curable composition is applied to the pattern shaped section such that the particle size of the microparticles of the curable composition during adhering is 0.5 mm or less. For example, when a releasing agent is applied to the mold, the microparticles of the curable composition are applied to the mold coated with the releasing agent, and when a releasing agent or the like is not applied, the microparticles of the curable composition are applied to the mold surface.

The curable composition is a composition that cures to form a resin molded article. The contact angle of the curable composition on the mold is 50° or less. As a result, the wettability of the curable composition on the mold increases, and therefore even in a case where the pattern shape has a fine structure, when the curable composition is adhered to the mold upon microparticle application, the curable composition tends to easily spread along the pattern shape, and bubbles are not easily formed.

When the curable composition is adhered to the mold upon microparticle application (more specifically, immediately before adhered), the particle size of the microparticles of the curable composition is, as described above, 0.5 mm or less, preferably 0.1 mm or less, and more preferably 0.05 mm or less. In addition, the lower limit is not particularly limited but is, for example, 0.001 mm. Setting the particle size to 0.5 mm or less enables reduction of the surface free energy of the microparticles of the curable composition. Furthermore, with the combination of the contact angle of 50° or less, the compatibility of the curable composition with the mold is improved, the curable composition more easily reaches tip ends of concave portions of the fine pattern formed in the mold, and the formation of air bubbles can be suppressed.

The particle size of the microparticles of the curable composition can be adjusted by the nozzle diameter (discharge port diameter) and the discharge velocity of the device (coater) used to apply the curable composition. When the curable composition is intermittently applied in a particulate form, the particle size of the microparticles of the curable composition becomes smaller than the nozzle diameter of the coater. For example, when the curable composition is intermittently applied in a particulate form using a coater with a cross-sectional nozzle diameter of 0.5 mm, the particle size of the microparticles of the curable composition can be determined to be 0.5 mm or less. Furthermore, an example of a method for measuring the particle size of the actual microparticles is a method in which images are captured of a granular curable composition at a fast shutter speed until the microparticles of the curable composition discharged from the coater impact the mold, and then the particle size is measured from the captured images.

The aspect ratio of the microparticles of the curable composition when the curable composition is adhered to the mold upon microparticle application (more specifically, immediately before adhered) is not particularly limited, but is preferably 0.1 or greater, and is more preferably 0.3 or greater. When the aspect ratio is 0.1 or greater, the microparticles of the curable composition are closer to a spherical shape, the surface free energy of the microparticles of the curable composition can be further reduced, and the curable composition readily reaches the tip ends of finely shaped concave portions formed in the mold, and thus the formation of air bubbles can be suppressed. The aspect ratio is the ratio of "lateral length (shorter length)/longitudinal length (longer length)".

The aspect ratio can be adjusted by the nozzle diameter (discharge port diameter) and discharge velocity of the coater that applies the microparticles. The aspect ratio can be measured, for example, by capturing images of a granular curable composition at a fast shutter speed until the microparticles of the curable composition discharged from the coater impact the mold, and then measuring the aspect ratio from the captured images.

Examples of the method for applying the microparticles include spray coating (spraying), air brush application (air brush spraying), and ultrasonic application (ultrasonic spraying). Use of these application methods to apply the microparticles facilitates the application of the curable composition such that the particle size of the microparticles when adhering to the mold is 0.5 mm or less (and the aspect ratio is 0.1 or greater).

A known or commonly used coater can be used to apply the microparticles. The nozzle diameter (discharge port diameter) of the coater is preferably 0.5 mm or less, more preferably 0.1 mm or less, and even more preferably 0.05 mm or less. In addition, the lower limit is not particularly limited but is, for example, 0.001 mm. Therefore, application of the microparticles is preferably performed by discharging the curable composition from a nozzle having a nozzle diameter of 0.5 mm or less.

The application speed (discharge speed) when applying the microparticles is preferably not greater than 55 mL/min, more preferably not greater than 30 mL/min, and even more preferably not greater than 10 mL/min. The lower limit is, for example, 0.1 mL/min from the perspective of productivity. When the application speed is not greater than 55 mL/min, the wetting of the curable composition on the mold can be controlled, and the formation of air bubbles can be further suppressed.

Application of the microparticles is preferably performed until it can be visually confirmed that a coating film of the curable composition is formed over at least the entire pattern shape. Furthermore, the microparticle application may be performed until the entire amount of the curable composition for forming the resin molded article is applied, but from the perspective of productivity, preferably, after microparticle application has been performed until it can be visually confirmed that a coating film of the curable composition is formed over the entire pattern shape, the entire remaining amount of the curable composition for forming a resin molded article is applied so that the particle size of the curable composition when adhering to the curable composition applied to the mold in the microparticle application step exceeds 0.1 mm. In other words, the curable composition application process (1) preferably includes, after the microparticle application step, applying the curable composition to the mold such that the particle size of the curable composition exceeds 0.1 mm when adhering to the curable composition applied to the mold. Note that in the present specification, the applying so that the particle size of the curable composition exceeds 0.1 mm may be referred to as "normal application" in contrast to "microparticle application".

The normal application can be performed by a known or commonly used application method. Examples of the normal application method include spin coating, roll coating, spray coating, dispense coating, dip coating, and inkjet coating.

In the curable composition application process (1), the mold coated (filled) with a curable composition on the pattern shaped section is obtained, as described above, by applying microparticles, and then implementing the normal application as necessary.

Curable Composition Application Process (2)
Conductive Substrate Coating Step

The curable composition application process (2) includes a conductive substrate coating step in which a conductive substrate is coated with a curable composition having a contact angle of 50° or less on a mold having a pattern shaped section, in the applying the curable composition to a portion of the mold uncoated with the curable composition (namely, a portion that is to be coated with the curable composition forming a resin molded article but is uncoated). Note that when the curable composition application process (2) is employed, a curable composition having a dielectric property (dielectric curable composition) is used as the curable composition.

The dielectric curable composition is a composition that cures to form a resin molded article. The contact angle of the dielectric curable composition on the mold is 50° or less. As a result, the wettability of the dielectric curable composition on the mold increases, and therefore even in a case where the pattern shape has a fine structure, when the dielectric curable composition is adhered to the mold through the application of voltage, the dielectric curable composition easily conforms to the pattern shape, and air bubbles are not easily formed.

A substrate made of a known or commonly used conductive material can be used as the conductive substrate. Examples of the conductive substrate include substrates made of a metal (metal substrate) such as gold, silver, copper, nickel, chromium, aluminum, and iron; and substrates made of a semiconductor (semiconductor substrate) such as silicon. Furthermore, a resin substrate to which electrical conductivity has been imparted by subjecting the surface of the resin substrate to a metal plating process may also be used. Furthermore, the conductive substrate may be a below-described mold having electrical conductivity.

Application to the conductive substrate can be performed by a known or commonly used application method. Examples of the application method include spin coating, roll coating, spray coating, dispense coating, dip coating, and inkjet coating.

Voltage Application Coating Step

The curable composition application process (2) includes, after the conductive substrate coating step, a step (which may be referred to as a "voltage application coating step") in which the dielectric curable composition coated surface of the conductive substrate and a surface of the mold having the pattern shaped section (mold having the pattern shaped section in order to impart a desired shape to the resin molded article) are arranged so as to face each other, and voltage is applied between the conductive substrate and the mold to cause the dielectric curable composition coated onto the conductive substrate to contact the portion of the mold uncoated with the curable composition and be applied thereto. Note that in the present specification, the application of the dielectric curable composition to the mold by applying voltage as described above may be referred to herein as a "voltage application coating".

The "portion of the mold uncoated with the curable composition" is a pattern shaped section of the mold that is to be coated with the curable composition (the dielectric curable composition and other curable composition) that forms a resin molded article, but that has not yet been coated. That is, in the voltage application coating step, when the curable composition that forms a resin molded article is to be applied to a mold, a dielectric curable composition having a contact angle of 50° or less on the mold is used as the curable composition to be initially applied to the mold, voltage is applied between the conductive substrate and the mold, and thereby the dielectric curable composition applied to the conductive substrate is brought into contact with the portion of the mold to which the pattern shape is imparted, and the dielectric curable composition is applied to the mold.

For example, when a releasing agent is applied to the mold, the dielectric curable composition is applied to the mold coated with the releasing agent, and when a releasing agent or the like is not applied, the dielectric curable composition is applied to the mold surface.

An important feature in the curable composition application process (2), is that, as described above, when a curable composition that forms a resin molded article is applied to a mold, a dielectric curable composition having a contact angle of 50° or less on the mold is used as the curable composition to be initially applied to the mold, and voltage is applied between the conductive substrate and the mold to thereby cause the dielectric curable composition to contact the mold and be applied thereto. As a result, when the dielectric curable composition is adhered to the mold during the coating by applying voltage, the dielectric curable composition easily conforms to the pattern shape, and air bubbles are not easily formed. In addition, according to the production method according to an embodiment of the present invention including the curable composition application process (2) in which the curable composition is applied through application of voltage, it is contemplated that the mold could deform due to the application of voltage, and it is thought that conformance to the pattern shape and suppression of the formation of air bubbles are improved due to the synergistic effect of the deformation of the dielectric curable composition and the deformation of the mold.

Figure 2A:
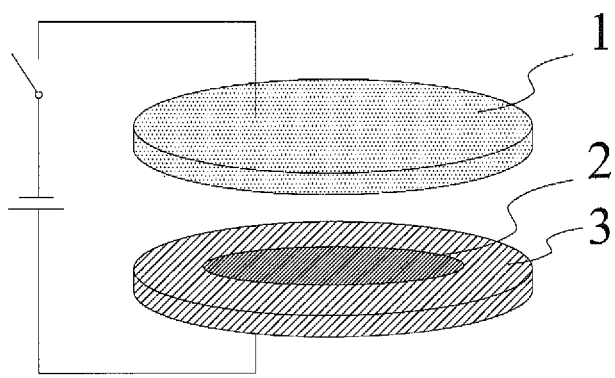
FIG. 2 is a schematic view illustrating a state in which a dielectric curable composition is brought into contact with a mold and applied thereto by applying voltage in the curable composition application process (2).
Figure 2B:
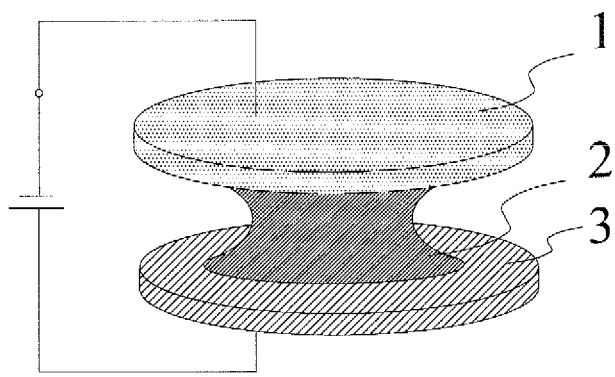
Figure 2C:
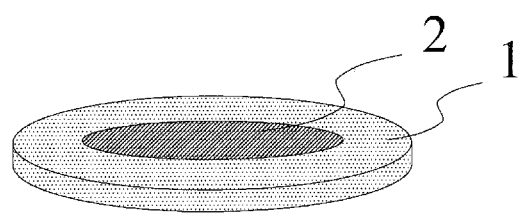

The process in which the dielectric curable composition is brought into contact with the mold and applied thereto through application of voltage in a mold coating process is described using FIG. 2. As illustrated in FIG. 2A, a mold 1 having a pattern shaped section on one surface and a conductive substrate 3 coated with a dielectric curable composition 2 prepared in the above-mentioned conductive substrate coating process are arranged such that the surface of the mold 1 having the pattern shaped section (lower surface in FIG. 2) and the surface of the conductive substrate 3 coated with the dielectric curable composition 2 (upper surface in FIG. 2) are mutually facing (opposing), and are connected by a conducting wire provided with a power source and a switch. Furthermore, the switch is turned on to apply voltage between the mold 1 and the conductive substrate 3. As a result, as illustrated in FIG. 2B, the dielectric curable composition 2 on the conductive substrate 3 extends toward the mold 1 and comes into contact with the mold 1, and the dielectric curable composition 2 is applied to the pattern shaped section of the mold 1. Furthermore, as illustrated in FIG. 2C, a mold 1 having the dielectric curable composition 2 applied to the pattern shaped section is obtained. Note that the positions of the power source and switch in the conducting wire are not particularly limited. Additionally, the positive electrode and the negative electrode of the power source may be reversed. Furthermore, as illustrated in FIG. 2A, the positional relationship between the mold 1 and the conductive substrate 3 may be such that the mold 1 is on the vertically upper side and the conductive substrate 3 in on the vertically lower side, or may be such that the mold 1 is on the vertically lower side and the conductive substrate 3 is on the vertically upper side.

The distance between the conductive substrate and the mold in the voltage application coating process is set, as appropriate, within a range such that the dielectric curable composition on the conductive substrate can contact the mold through application of voltage. In addition, the voltage to be applied is set, as appropriate, within a range such that the dielectric curable composition on the conductive substrate can contact the mold through application of the voltage, and is, for example, from 100 to 500 V.

The voltage application coating is preferably performed until it can be visually confirmed that a coating film of the dielectric curable composition is formed over at least the entire pattern shape. Furthermore, the voltage application coating may be performed until the entire amount of the curable composition for forming the resin molded article is applied, or, after the voltage application coating has been performed until it can be visually confirmed that a coating film of a dielectric curable composition is formed over the entire pattern shape, the entire remaining amount of the curable composition for forming the resin molded article may be applied through another application method. From the perspective of productivity, the another application method is preferably a method of application at an application speed of 100 mL/min or greater (preferably 1000 mL/min or greater). That is, the curable composition application process (2) preferably includes, after the voltage application coating step, applying the curable composition to the mold at an application speed of 100 mL/min or greater (preferably 1000 ml/min or greater). Note that the curable composition that is applied by the another application method may be the dielectric curable composition described above, or may be another curable composition. Moreover, the another curable composition may or may not have dielectric properties.

The another application method can be performed by a known or commonly used application method. Examples of the another application method include spin coating, roll coating, spray coating (spraying), dispense coating, dip coating, inkjet coating, airbrush coating (airbrush spraying), and ultrasonic coating (ultrasonic spraying).

In the curable composition application process (2), the mold coated (filled) with a curable composition including the dielectric curable composition on the pattern shaped section is obtained by implementing application through the voltage application coating followed by, as necessary, the another application method.

Curable Composition Application Process (3)

The curable composition application process (3) is a process in which a curable composition having a contact angle of 50° or less on a mold having a pattern shaped section that has been subjected to a wettability improvement treatment on a surface is applied to a portion of the mold uncoated with the curable composition (namely, a portion that is to be coated with the curable composition forming a resin molded article but is uncoated).

Application of the curable composition can be performed by a known or commonly used application method. Examples of the application method include spin coating, roll coating, spray coating (spraying), dispense coating, dip coating, inkjet coating, airbrush coating (airbrush spraying), and ultrasonic coating (ultrasonic spraying).

The curable composition is a composition that cures to form a resin molded article. The contact angle of the curable composition on the mold before the wettability improvement treatment is performed is 50° or less. As a result, the wettability of the curable composition on the mold increases, and therefore even in a case where the pattern shaped section has a fine structure, when the curable composition is adhered to the mold upon curable composition application, the curable composition tends to easily spread along the pattern shape, and air bubbles are not easily formed.

At a step prior to applying the curable composition, the mold is subjected to a wettability improvement treatment on the surface of the pattern shaped section. The wettability improvement treatment is preferably a plasma discharge treatment, a corona discharge treatment, an ozone exposure treatment, or an excimer treatment, and is more preferably a plasma discharge treatment or a corona discharge treatment. The wettability of the curable composition is improved by subjecting the mold to these wettability improvement treatments. Furthermore, when this treatment is combined with the use of a curable composition having a contact angle of 50° or less, the compatibility of the curable composition with the mold is further improved, the curable composition more easily reaches tip ends of concave portions of the fine pattern shaped section formed in the mold, and the formation of air bubbles can be suppressed.

A plasma discharge treatment is a process in which a mold surface is treated by generating positively and negatively charged particles activated through discharging in the atmosphere. A corona discharge treatment is a process in which a mold surface is treated by generating a non-uniform electric field around a pointed electrode (needle electrode) and continuously discharging. An ozone exposure treatment is a process in which a mold surface is treated by generating ozone through ultraviolet irradiation using, for example, a low-pressure mercury lamp in the presence of oxygen. An excimer treatment is a process in which a mold surface is treated by ultraviolet irradiation or laser irradiation using an excimer lamp in a vacuum state.

The discharge amount of the plasma discharge treatment or the corona discharge treatment is not particularly limited, but is preferably 50 W·min/m$^2$ or greater, and more preferably 80 W·min/m$^2$ or greater. When the discharge amount is 50 W min/m$^2$ or greater, wettability of the curable composition is further improved, and air bubbles after application is less likely to form.

In the curable composition application process (3), a mold coated (filled) with a curable composition on the pattern shaped section that has been subjected to a wettability improvement treatment on the surface is obtained.

Curable Composition Application Process (4)

The curable composition application process (4) includes a step (which may be referred to as a "heat application step") in which a curable composition having a contact angle of 50° or less on a mold with a pattern shaped section and having a temperature that is 3 to 7° C. higher than a surface temperature of the mold is applied to a portion of the mold that is uncoated with the curable composition (namely, a portion that is to be coated with the curable composition forming a resin molded article but is uncoated) and has a surface temperature at the pattern shaped section of from 35 to 55° C. Note that in the present specification, the applying a curable composition having a contact angle of 50° or less on a mold and having a temperature that is 3 to 7° C. higher than a surface temperature of the mold, to a portion of the mold that is uncoated with the curable composition and has a surface temperature of from 35 to 55° C., may be referred to as "heat application".

That is, in the heat application step, when the curable composition is applied to a mold, a curable composition having a contact angle of 50° or less on the mold is used as the curable composition forming a resin molded article that is first applied to the mold. Furthermore, at this time, the surface temperature of the portion to be coated with the curable composition (pattern shaped section where the curable composition is not yet applied) is from 35 to 55° C., and the curable composition is applied at a temperature that is 3 to 7° C. higher than the surface temperature of the mold. For example, when a releasing agent is applied to the mold, the curable composition is applied to the mold coated with the releasing agent, and when a releasing agent or the like is not applied, the curable composition is applied to the mold surface.

The surface temperature of the mold upon heat application is from 35 to 55° C., as described above, and is preferably from 40 to 50° C. Note that the surface temperature at at least the location where the curable composition is applied is preferably within the aforementioned range.

Furthermore, the temperature of the curable composition upon heat application is from 3 to 7° C. higher than the surface temperature of the mold as described above. That is, the difference between the surface temperature of the mold and the temperature of the curable composition upon heat application, namely, ((mold surface temperature)–(curable composition temperature)), is from 3 to 7° C., and is preferably from 4 to 6° C.

The temperature of the curable composition upon heat application is not particularly limited, but is preferably from 36 to 62° C., more preferably from 40 to 60° C., and even more preferably from 43 to 57° C. When the temperature is within the aforementioned range, the compatibility of the curable composition with the mold is further improved, the curable composition more easily reaches tip ends of concave portions of the fine pattern shape formed in the mold, and the formation of air bubbles can be further suppressed.

The curable composition is a composition that cures to form a resin molded article. The contact angle of the curable composition on the mold is 50° or less. As a result, the wettability of the curable composition on the mold increases, and therefore even in a case where the pattern shape has a fine structure, when the curable composition is adhered to the mold upon curable composition application, the curable composition tends to easily spread along the pattern shape, and air bubbles are not easily formed.

Since the production method according to an embodiment of the present invention including the curable composition application process (4) satisfies all of that: a curable composition having a contact angle of 50° or less is used; the surface temperature of the mold during heat application is from 35 to 55° C.; and the temperature of the curable composition is from 3 to 7° C. higher than the above-mentioned surface temperature, the compatibility of the curable composition with the mold is further improved, the curable composition more easily reaches tip ends of concave portions of the fine pattern shaped section formed in the mold, and the formation of air bubbles can be suppressed.

Application of the curable composition can be performed by a known or commonly used application method. Examples of the application method include spin coating, roll coating, spray coating (spraying), dispense coating, dip coating, inkjet coating, airbrush coating (airbrush spraying), and ultrasonic coating (ultrasonic spraying).

The heat application is preferably performed until it can be visually confirmed that a coating film of the curable composition is formed over at least the entire pattern shaped section. Furthermore, the heat application may be performed until the entire amount of the curable composition for forming the resin molded article is applied, or, after the heat application has been performed until it can be visually confirmed that a coating film of the curable composition is formed over the entire pattern shaped section, the entire remaining amount of the curable composition for forming a resin molded article may be applied through another application method. Examples of the another application method include a method in which application is performed with the surface temperature of the mold and/or the temperature of the curable composition being a temperature (for example, from 20 to 30° C.) that is outside the temperature range specified for the heat application.

In the curable composition application process (4), a mold coated (filled) with the curable composition on the pattern shaped section is obtained by implementing heat application, followed by, as necessary, application through the another application method.

Curable Composition

The curable composition (including the dielectric curable composition) is a composition that cures to form a resin molded article. The contact angle of the curable composition on the mold is 50° or less, preferably 45° or less, and more preferably 40° or less. The contact angle can be measured using a known or commonly used method.

The curable composition contains a compound that can be cured (curable compound). As the curable composition, a known or commonly used composition that is used in imprint molding can be used, and the composition is appropriately selected according to the type of the targeted resin molded article. Examples of the curable compound include cationically curable compounds, radically curable compounds, and anionically curable compounds. Examples of the cationically curable compounds include compounds having an epoxy group (epoxy compounds), compounds having an oxetanyl group (oxetane compounds), and compounds having a vinyl ether group (vinyl ether compounds), and epoxy compounds are preferable. One type of curable compound may be used alone, or two or more types of curable compounds may be used.

The epoxy compound is not particularly limited, and a well-known or commonly used compound having one or more epoxy groups (oxirane rings) per molecule can be used. Examples thereof include alicyclic epoxy compounds (alicyclic epoxy resins), aromatic epoxy compounds (aromatic epoxy resins), and aliphatic epoxy compounds (aliphatic epoxy resins).

The alicyclic epoxy compound is not particularly limited, and examples include well-known or commonly used compounds having one or more alicyclic rings and one or more epoxy groups per molecule. Examples thereof include (1) compounds having, per molecule, an epoxy group constituted of an oxygen atom and two adjacent carbon atoms constituting an alicyclic ring (referred to as an "alicyclic epoxy group"); (2) compounds in which an epoxy group is directly bonded by a single bond to an alicyclic ring; and (3) compounds having an alicyclic ring and a glycidyl ether group per molecule (a glycidyl ether type epoxy compound).

Examples of the compound (1) having an alicyclic epoxy group in the molecule include compounds represented by Formula (i) below.

[Chem. 1]

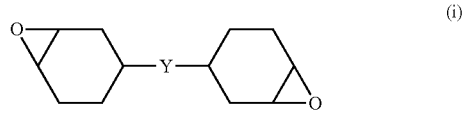

(i)

In Formula (i) above, Y represents a single bond or a linking group (a divalent group having one or more atoms). Examples of the linking group include divalent hydrocarbon groups, alkenylene groups in which some or all of the carbon-carbon double bonds are epoxidized, carbonyl groups, ether bonds, ester bonds, carbonate groups, amide groups, and groups in which a plurality of these are linked. Note that substituents such as alkyl groups may be bonded to one or more of the carbon atoms constituting the cyclohexane ring (cyclohexene oxide group) in Formula (i).

Examples of the divalent hydrocarbon group include linear or branched alkylene groups having from 1 to 18 carbon atoms and divalent alicyclic hydrocarbon groups. Examples of the linear or branched alkylene group having from 1 to 18 carbon atoms include a methylene group, a methyl methylene group, a dimethyl methylene group, an ethylene group, a propylene group, and a trimethylene group. Examples of the divalent alicyclic hydrocarbon group include divalent cycloalkylene groups (including a cycloalkylidene group) such as a 1,2-cyclopentylene group, a 1,3-cyclopentylene group, a cyclopentylidene group, a 1,2-cyclohexylene group, a 1,3-cyclohexylene group, a 1,4-cyclohexylene group, and a cyclohexylidene group.

Examples of the alkenylene group in the alkenylene group in which some or all of the carbon-carbon double bonds are epoxidized (which may be referred to as an "epoxidized alkenylene group") include linear or branched alkenylene groups having from 2 to 8 carbon atoms, such as a vinylene group, a propenylene group, a 1-butenylene group, a 2-butenylene group, a butadienylene group, a pentenylene group, a hexenylene group, a heptenylene group, and an octenylene group. In particular, the epoxidized alkenylene group is preferably an alkenylene group in which all of the carbon-carbon double bonds are epoxidized, and is more preferably an alkenylene group having from 2 to 4 carbon atoms in which all of the carbon-carbon double bonds are epoxidized.

Representative examples of the alicyclic epoxy compound represented by Formula (i) above include (3,4,3',4'-diepoxy)bicyclohexyl and compounds represented by Formulas (i-1) to (i-10) below. Note that in Formulas (i-5) and (i-7) below, l and m each represent an integer from 1 to 30. R' in Formula (i-5) below is an alkylene group having from 1 to 8 carbon atoms, and, among these, a linear or branched alkylene group having from 1 to 3 carbon atoms, such as a methylene group, an ethylene group, a propylene group, or an isopropylene group, is preferred. In Formulas (i-9) and (i-10) below, n1 to n6 each represent an integer from 1 to 30. In addition, other examples of the alicyclic epoxy compound represented by the formula (i) above include 2,2-bis(3,4-epoxycyclohexyl)propane, 1,2-bis(3,4-epoxycyclohexan-1-yl)ethane, 1,2-epoxy-1,2-bis(3,4-epoxycyclohexan-1-yl)ethane, and bis(3,4-epoxycyclohexylmethyl)ether.

[Chem. 2]

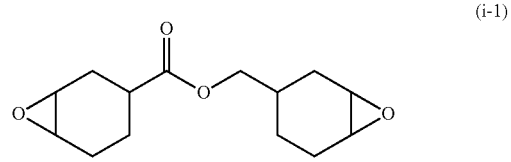

(i-1)

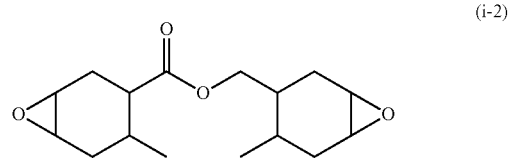

(i-2)

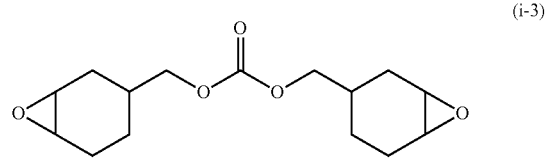

(i-3)

-continued (i-4)
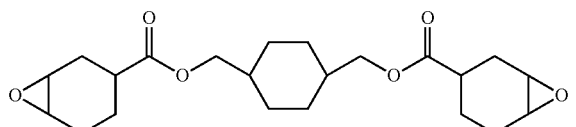

(i-5)
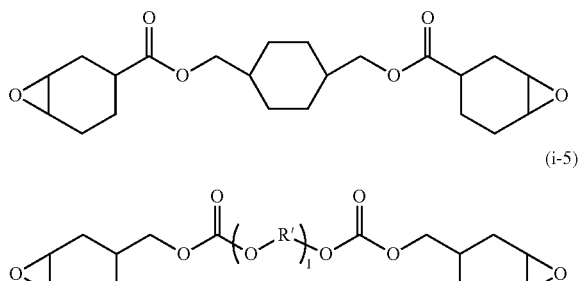

(i-6)

(i-7)

(i-8)

[Chem. 3]

(i-9)
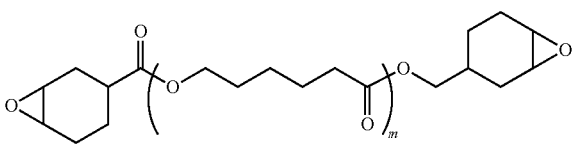

(i-10)
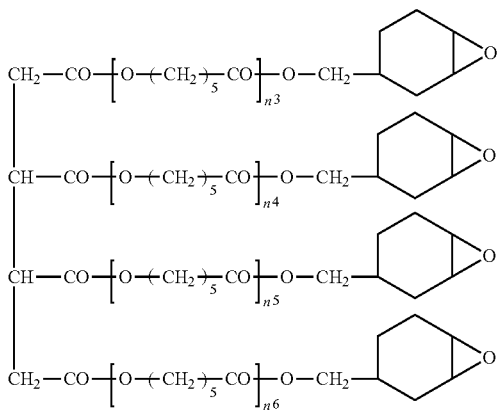

Examples of the above-described compound (2) in which an epoxy group is directly bonded by a single bond to an alicyclic ring include compounds represented by Formula (ii) below.

[Chem. 4]

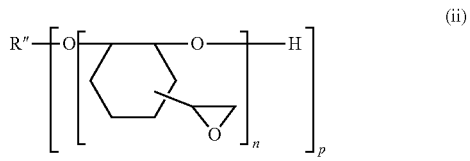

(ii)

In Formula (ii), R" is a group (p-valent organic group) resulting from elimination of p hydroxyl groups (—OH) from a structural formula of a p-hydric alcohol, where p and n each represent a natural number. Examples of the p-hydric alcohol [R"(OH)$_p$] include polyhydric alcohols (alcohols having from 1 to 15 carbons, etc.) such as 2,2-bis(hydroxymethyl)-1-butanol. Here, p is preferably from 1 to 6, and n is preferably from 1 to 30. When p is 2 or greater, n in each group in parentheses (in the outer parentheses) may be the same or different. Examples of the compound represented by Formula (ii) specifically include a 1,2-epoxy-4-(2-oxiranyl)cyclohexane adduct of 2,2-bis(hydroxymethyl)-1-butanol, for example, product under the trade name "EHPE3150" (available from Daicel Corporation).

Examples of the above-described compound (3) having an alicyclic ring and a glycidyl ether group in the molecule include glycidyl ethers of alicyclic alcohols (in particular, alicyclic polyhydric alcohols). More particularly, examples thereof include compounds obtained by hydrogenating a bisphenol A type epoxy compound (a hydrogenated bisphenol A type epoxy compound), such as 2,2-bis[4-(2,3-epoxypropoxy)cyclohexyl]propane and 2,2-bis[3,5-dimethyl-4-(2,3-epoxypropoxy)cyclohexyl]propane; compounds obtained by hydrogenating a bisphenol F type epoxy compound (a hydrogenated bisphenol F type epoxy compound), such as bis[o,o-(2,3-epoxypropoxy)cyclohexyl]methane, bis[o,p-(2,3-epoxypropoxy)cyclohexyl]methane, bis[p,p-(2,3-epoxypropoxy)cyclohexyl]methane, and bis[3,5-dimethyl-4-(2,3-epoxypropoxy)cyclohexyl]methane; a hydrogenated bisphenol type epoxy compound; a hydrogenated phenol novolac type epoxy compound; a hydrogenated cresol novolac type epoxy compound; a hydrogenated cresol novolac type epoxy compound of bisphenol A; a hydrogenated naphthalene type epoxy compound; a hydrogenated epoxy compound of an epoxy compound obtained from trisphenolmethane; and a hydrogenated epoxy compound of an aromatic epoxy compound described below.

Examples of the aromatic epoxy compound include an epibis type glycidyl ether type epoxy resin obtained by a condensation reaction of bisphenols (for example, bisphenol A, bisphenol F, bisphenol S, and fluorenebisphenol) and an epihalohydrin; a high molecular weight epibis type glycidyl ether type epoxy resin obtained by further subjecting the above epibis type glycidyl ether type epoxy resin to an addition reaction with the bisphenol described above; a novolac alkyl type glycidyl ether type epoxy resin obtained by subjecting a phenol (for example, phenol, cresol, xylenol, resorcin, catechol, bisphenol A, bisphenol F, and bisphenol S) and an aldehyde (for example, formaldehyde, acetaldehyde, benzaldehyde, hydroxybenzaldehyde, and salicylaldehyde) to a condensation reaction to obtain a polyhydric alcohol, and then further subjecting the polyhydric alcohol to condensation reaction with epihalohydrin; and an epoxy compound in which two phenol skeletons are bonded at the 9-position of the fluorene ring, and glycidyl groups are each bonded directly or via an alkyleneoxy group to an oxygen atom resulting from elimination of a hydrogen atom from a hydroxy group of these phenol skeletons.

Examples of the aliphatic epoxy compound include glycidyl ethers of a q-hydric alcohol not having a cyclic structure (q is a natural number); glycidyl esters of monovalent or polyvalent carboxylic acids (for example, acetic acid, propionic acid, butyric acid, stearic acid, adipic acid, sebacic acid, maleic acid, and itaconic acid); epoxidized materials of fats and oils including a double bond, such as epoxidized linseed oil, epoxidized soybean oil, and epoxidized castor oil; and epoxidized materials of polyolefins (including polyalkadienes), such as epoxidized polybutadiene. Here, examples of the q-hydric alcohol not having a cyclic structure include monohydric alcohols, such as methanol, ethanol, 1-propyl alcohol, isopropyl alcohol, and 1-butanol; dihydric alcohols, such as ethylene glycol, 1,2-propanediol, 1,3-propanediol, 1,4-butanediol, neopentyl glycol, 1,6-hexanediol, diethylene glycol, triethylene glycol, tetraethylene glycol, dipropylene glycol, polyethylene glycol, and polypropylene glycol; and trihydric or higher polyhydric alcohols, such as glycerin, diglycerin, erythritol, trimethylolethane, trimethylolpropane, pentaerythritol, dipentaerythritol, and sorbitol. In addition, the q-hydric alcohol may be a polyether polyol, a polyester polyols, a polycarbonate polyol, a polyolefin polyol, or the like.

The oxetane compound is not particularly limited, and examples include well-known or commonly used compounds having one or more oxetane rings per molecule. Examples thereof include 3,3-bis(vinyloxymethyl)oxetane, 3-ethyl-3-(hydroxymethyl)oxetane, 3-ethyl-3-(2-ethylhexyloxymethyl)oxetane, 3-ethyl-3-[(phenoxy)methyl]oxetane, 3-ethyl-3-(hexyloxymethyl)oxetane, 3-ethyl-3-(chloromethyl)oxetane, 3,3-bis(chloromethyl)oxetane, 1,4-bis[(3-ethyl-3-oxetanylmethoxy)methyl]benzene, bis{[1-ethyl(3-oxetanyl)]methyl}ether, 4,4'-bis[(3-ethyl-3-oxetanyl)methoxymethyl]bicyclohexyl, 1,4-bis[(3-ethyl-3-oxetanyl)methoxymethyl]cyclohexane, 1,4-bis{[(3-ethyl-3-oxetanyl)methoxy]methyl}benzene, 3-ethyl-3-{[(3-ethyloxetan-3-yl)methoxy]methyl oxetane, xylylenebisoxetane, 3-ethyl-3-{[3-(triethoxysilyl)propoxy]methyl}oxetane, oxetanylsilsesquioxane, and phenol novolac oxetane.

The vinyl ether compound is not particularly limited, and a well-known or commonly used compound having one or more vinyl ether groups per molecule can be used. Examples thereof include 2-hydroxyethyl vinyl ether (ethyleneglycol monovinyl ether), 3-hydroxypropyl vinyl ether, 2-hydroxypropyl vinyl ether, 2-hydroxyisopropyl vinyl ether, 4-hydroxybutyl vinyl ether, 3-hydroxybutyl vinyl ether, 2-hydroxybutyl vinyl ether, 3-hydroxyisobutyl vinyl ether, 2-hydroxyisobutyl vinyl ether, 1-methyl-3-hydroxypropyl vinyl ether, 1-methyl-2-hydroxypropyl vinyl ether, 1-hydroxymethylpropyl vinyl ether, 4-hydroxycyclohexyl vinyl ether, 1,6-hexanediol monovinyl ether, 1,6-hexanediol divinyl ether, 1,8-octanediol divinyl ether, 1,4-cyclohexanedimethanol monovinyl ether, 1,4-cyclohexanedimethanol divinyl ether, 1,3-cyclohexanedimethanol monovinyl ether, 1,3-cyclohexanedimethanol divinyl ether, 1,2-cyclohexanedimethanol monovinyl ether, 1,2-cyclohexanedimethanol divinyl ether, p-xylene glycol monovinyl ether, p-xylene glycol divinyl ether, m-xylene glycol monovinyl ether, m-xylene glycol divinyl ether, o-xylene glycol monovinyl ether, o-xylene glycol divinyl ether, ethylene glycol divinyl ether, diethylene glycol monovinyl ether, diethylene glycol divinyl ether, triethylene glycol monovinyl ether, triethylene glycol divinyl ether, tetraethylene glycol monovinyl ether, tetraethylene glycol divinyl ether, pentaethylene glycol monovinyl ether, pentaethylene glycol divinyl ether, oligoethylene glycol monovinyl ether, oligoethylene glycol divinyl ether, polyethylene glycol monovinyl ether, polyethylene glycol divinyl ether, dipropylene glycol monovinyl ether, dipropylene glycol divinyl ether, tripropylene glycol monovinyl ether, tripropylene glycol divinyl ether, tetrapropylene glycol monovinyl ether, tetrapropylene glycol divinyl ether, pentapropylene glycol monovinyl ether, pentapropylene glycol divinyl ether, oligopropyleneglycol monovinyl ether, oligopropyleneglycol divinyl ether, polypropyleneglycol monovinyl ether, polypropyleneglycol divinyl ether, isosorbide divinyl ether, oxanorbornene divinyl ether, phenyl vinyl ether, n-butyl vinyl ether, isobutyl vinyl ether, octyl vinyl ether, cyclohexyl vinyl ether, hydroquinone divinyl ether, 1,4-butanediol divinyl ether, cyclohexanedimethanol divinyl ether, trimethylolpropane divinyl ether, trimethylolpropane trivinyl ether, bisphenol A divinyl ether, bisphenol F divinyl ether, hydroxyoxanorbornanemethanol divinyl ether, 1,4-cyclohexanediol divinyl ether, pentaerythritol trivinyl ether, pentaerythritol tetravinyl ether, dipentaerythritol pentavinyl ether, and dipentaerythritol hexavinyl ether.

The content of the curable compound (particularly the epoxy compound) in the curable composition is not particularly limited, but is preferably from 10 to 95 wt. %, more preferably from 15 to 90 wt. %, and even more preferably from 20 to 85 wt. %, relative to the total amount (100 wt. %) of the curable composition. When the content is 10 wt % or greater, there is a tendency for the curable composition to excel in curability, and in heat resistance, light resistance, and transparency of the resin molded article.

The curable composition preferably contains a photopolymerization initiator along with the curable compound, and particularly preferably contains a photocationic polymerization initiator. The photocationic polymerization initiator is a compound that generates an acid by irradiation with light and initiates a curing reaction of a curable compound (particularly a cationically curable compound) included in the curable composition, and the photocationic polymerization initiator is made from a cationic moiety that absorbs light and an anionic moiety that serves as a source for generating the acid.

Examples of the photocationic polymerization initiator include diazonium salt compounds, iodonium salt compounds, sulfonium salt compounds, phosphonium salt compounds, selenium salt compounds, oxonium salt compounds, ammonium salt compounds, and bromine salt compounds. In the present invention, of these, a sulfonium salt compound is preferably used from the perspective of being able to form a resin molded article having excellent curability.

Examples of the cationic moiety of the sulfonium salt compound include arylsulfonium ions (particularly, triaryl sulfonium ions), such as a triphenyl sulfonium ion, a diphenyl[4-(phenylthio)phenyl]sulfonium ion, a tri-p-tolylsulfonium ion, a (4-hydroxyphenyl)methylbenzyl sulfonium ion, a 4-(4-biphenylylthio)phenyl-4-biphenylyl phenylsulfonium ion.

Examples of the anionic moiety include $[(X)_sB(Phf)_{4-s}]^-$ (where X denotes a phenyl group or a biphenylyl group; Phf denotes a phenyl group in which at least one hydrogen atom is substituted with one selected from the group consisting of a perfluoroalkyl group, a perfluoroalkoxy group, and a halogen atom; and s is an integer of 0 to 3), $BF_4^-$, $[(Rf)_nPF_{6-n}]^-$ (Rf: an alkyl group in which 80% or more of the hydrogen atoms are substituted with fluorine atoms, n: an integer of 0 to 5), $AsF_6^-$, $SbF_6^-$, and pentafluorohydroxy antimonate.

Examples of photocationic polymerization initiators that can be used include (4-hydroxyphenyl)methylbenzyl sulfonium tetrakis(pentafluorophenyl)borate, 4-(4-biphenylylthio)phenyl-4-biphenylyl phenyl sulfonium tetrakis(pentafluorophenyl)borate, 4-(phenylthio)phenyl diphenyl sulfonium phenyltris(pentafluorophenyl)borate, [4-(4-biphenylylthio)phenyl]-4-biphenylyl phenylsulfonium phenyl tris(pentafluorophenyl)borate, diphenyl[4-(phenylthio)phenyl]sulfonium tris(pentafluoroethyl)trifluorophosphate, diphenyl[4-(phenylthio)phenyl]sulfonium tetrakis(pentafluorophenyl)borate, diphenyl[4-(phenylthio)phenyl]sulfonium hexafluorophosphate, 4-(4-biphenylylthio)phenyl-4-biphenylyl phenylsulfonium tris(pentafluoroethyl)trifluorophosphate, bis[4-(diphenylsulfonio)phenyl]sulfide phenyl tris(pentafluorophenyl)borate, [4-(2-thioxanthonylthio)phenyl]phenyl-2-thioxanthonyl sulfonium phenyl tris(pentafluorophenyl)borate, and products under the trade names "Cyracure UVI-6970", "Cyracure VUI-6974", "Cyracure UVI-6990", and "Cyracure UVI-950" (the above-mentioned are available from Union Carbide Corporation, U.S.), "Irgacure 250", "Irgacure 261", and "Irgacure 264" (the above-mentioned are available from Ciba Specialty Chemicals Inc.), "SP-150", "SP-151", "SP-170", and "Optomer SP-171" (the above-mentioned are available from Adeka Corporation), "CG-24-61" (available from Ciba Specialty Chemicals Inc.), "DAICAT II" (available from Daicel Corporation), "UVAC 1590" and "UVAC 1591" (available from Daicel Cytec Co., Ltd.), "CI-2064", "CI-2639", "CI-2624", "CI-2481", "CI-2734", "CI-2855", "CI-2823", "CI-2758", and "CIT-1682" (the above-mentioned are available from Nippon Soda Co., Ltd.), "PI-2074" (available from Rhodia, tetrakis(pentafluorophenyl borate)toluic cumyl iodonium salt), "FFC509" (available from 3M), "BBI-102", "BBI-101", "BBI-103", "MPI-103", "TPS-103", "MDS-103", "DTS-103", "NAT-103", and "NDS-103" (the above-mentioned are available from Midori Kagaku Co., Ltd.), "CD-1010", "CD-1011", and "CD-1012" (the above-mentioned are available from Sartomer Co., Inc., U.S.), and "CPI-100P", "CPI-101A", and "CPI-200K" (the above-mentioned are available from San-Apro Ltd.).

One type of photopolymerization initiator may be used alone, or two or more types of photopolymerization initiators may be used. The usage amount (blended amount) is preferably from 0.01 to 15 parts by weight, more preferably from 0.05 to 10 parts by weight, and even more preferably from 0.1 to 5 parts by weight per 100 parts by weight of the curable compound (in particular, the cationically curable compound) contained in the curable composition. A resin molded article excelling in curability, heat resistance, light resistance, transparency, and optical properties can be obtained by using the photopolymerization initiator within the range described above.

The curable composition may contain the curable compound, the photopolymerization initiator, and other components as necessary (for example, solvents, antioxidants, photosensitizers, defoaming agent, leveling agents, coupling agents, surfactants, flame retardants, ultraviolet absorbers, and colorants). Commercially available products such as, for example, product under the trade name CELVENUS OUH106 (available from Daicel Corporation) can also be used as the curable composition.

Mold

The mold is imparted with an inverted concavo-convex shaped pattern corresponding to the desired shape of the resin molded article (inverted shape of the desired resin molded article) in order to impart the desired shape to the resin molded article. The mold need only be such that the contact angle of the curable composition forming the resin molded article is 50° or less on the mold, but the mold is preferably made of resin. The resin for forming the mold is selected with consideration of the contact angle of the curable composition and the releasability of the resin molded article after curing, and examples of the resin include silicone resins (dimethylpolysiloxane and the like), fluororesins, polyolefin resins (polyethylene, polypropylene, polycyclic olefin, and the like), polyethersulfone resins, polycarbonate resins, polyester resins (polyarylate, polyethylene terephthalate, polyethylene naphthalate, and the like), polyamide resins, and polymethyl methacrylates. Among these, silicone resins are preferable as the resin. When a silicone resin is used, the compatibility with the curable composition containing the epoxy compound is excellent, and the contact angle tends to be easily reduced. Additionally, resin molded articles can be more easily removed because releasability of the resin molded article and flexibility of the mold are excellent. The mold may be a commercially available product or may be manufactured. When the mold is to be manufactured, the mold can be manufactured, for example, by molding (preferably imprint molding) a resin composition that forms the mold, and then heat-curing.

When used in the curable composition application process (2), the above-mentioned resin mold may contain a conductive material such as a metal in order to exhibit conductivity. Examples of the conductive resin mold include a resin mold containing conductive particles, a resin mold having a conductive film such as a metal film on at least the surface of the pattern shaped section of the resin mold, a resin mold having a conductive substrate such as a metal plate embedded inside the resin mold (in particular, near the pattern shaped section inside the resin mold), and a resin mold having a conductive film such as a metal film on a surface opposing the pattern shaped section of the resin mold. In addition, the resin mold may be subjected to a plasma treatment at at least the pattern shaped section in order to exhibit conductivity. Additionally, the conductive particles or conductive film may be partially disposed according to the pattern shape and pattern cycle of the resin mold. Examples of the conductive materials include those exemplified as conductive materials such as a metal constituting the conductive substrate described above. The metal film can be provided on the mold surface by a known or commonly used method such as, for example, a metal vapor deposition process.

The mold may include a mold release agent applied onto at least a portion of the pattern shaped section. When a releasing agent is applied to the mold prior to application of the curable composition, the formed resin molded article can be easily released when removed (released) from the mold. In this case, since the release layer is normally released simultaneously from the mold, the obtained resin molded article has at least one release layer on the surface.

Examples of the releasing agent include fluorine-based releasing agents, silicone-based releasing agents, and wax-based releasing agents. One type of releasing agent may be used alone, or two or more types of releasing agents may be used. Examples of the method for applying the releasing agent include spraying, spin coating, and screen printing.

Defoaming Process

The production method according to an embodiment of the present invention may further include, after the curable composition application process, a process of defoaming to eliminate air bubbles in the applied curable composition (defoaming process). In the production method according to an embodiment of the present invention, during the curable composition application process described above, the generation of air bubbles in the curable composition is significantly suppressed, and the slight amount of formed bubbles can be removed by the defoaming process.

The defoaming can be performed by a known or commonly used defoaming method, and defoaming through reduced pressure (reduced pressure defoaming or vacuum defoaming) is preferable. The vacuum defoaming can be performed, for example, by placing the mold filled with the curable composition under a pressure of 0.1 to 20 kPa for 1 to 10 minutes.

Mold Closing Process

A process (mold closing process) is performed in which a mold coated (filled) with the curable composition and obtained via the curable composition application process (and if necessary, the defoaming process) is superimposed on another substrate so as to sandwich the applied curable composition. Namely, the mold coated with the curable composition and the other substrate are used as an upper mold and a lower mold, respectively, and a process of closing the upper mold and the lower mold is performed so as to sandwich the curable composition. Here, it is not a matter which of the mold or the other substrate is used as the upper mold or the lower mold.

The other substrate may be a mold having a pattern shaped section (other mold than the mold coated with the curable composition that is subjected to the curable composition application process through one or more of the curable composition application process (1) to (4)), or may be a substrate (planar substrate) without a pattern shape. For example, when a resin molded article having a concavo-convex shape on only one surface is produced, the abovementioned planar substrate can be used as the other substrate, and when a resin molded article having a concavo-convex shape on both sides is produced, the abovementioned other mold can be used as the other substrate.

As the other mold described above, the same mold as the mold used in one or more curable composition application processes of the curable composition application processes (1) to (4) may be used. The two molds described above may be formed from different materials or may be formed from the same material. The two molds described above may have the same pattern shape or may have different pattern shapes. Further, the other mold described above may be a mold coated with a releasing agent, or a mold that has been subjected to a wettability improvement treatment.

Examples of the planar substrate include glass plates; semiconductors such as silicon, gallium arsenide, and gallium nitride; resin substrates such as polycarbonate, polypropylene, and polyethylene; metal substrates; and combinations of these materials. The planar substrate may have a pattern structure such as fine wiring, a crystalline structure, an optical waveguide structure, a holographic structure, or other such optical structures.

The other substrate may be either coated or uncoated with the curable composition. When the other substrate is coated with the curable composition, a substrate coated (filled) with the curable composition through one or more curable composition application processes of the curable composition application processes (1) to (4) (and as necessary, a defoaming process) may be used. In particular, when a mold is used as the other substrate (that is, when a resin molded article having a concavo-convex shape on both sides is produced), the mold used as the other substrate is preferably a mold that is coated (filled) with the curable composition through one or more curable composition application processes of the curable composition application processes (1) to (4) (and as necessary, the defoaming process). When a substrate coated with a curable composition is used as the other substrate, in the mold closing process, the upper mold and the lower mold are superimposed so that the curable compositions contact each other.

When the curable composition application process (2) is employed, a conductive mold can be used as the other substrate. In this case, it is not necessary to coat the upper mold and coat the lower mold with the dielectric curable composition in a separate way. For example, after coating of a conductive mold as a lower mold, the dielectric curable composition is brought into contact with a conductive mold as an upper mold while applying voltage to the lower mold and upper mold, whereby the molds can be closed simultaneously, after which the closed molds can be pressed in a pressing process described below. Furthermore, in this case, the processes of separately coating the upper mold and the lower mold are performed in one batch, and therefore an effect of shortening the process can be obtained, and workability is also excellent.

Pressing Process

The production method according to an embodiment of the present invention may include, after the mold closing process, a process of pressing (pressing process) from an upper part of the upper mold. Consequently, the adhesion between the upper mold and the lower mold is increased, and thickness variations can be prevented. The pressure during pressing is, for example, from 0.01 to 100 MPa.

Curing Process

In the curing process, the curable composition that has been applied to (used to fill) the mold is cured to obtain a resin molded article. Specifically, the curable composition can be cured by conducting a polymerization reaction of the curable compound (particularly the cationically curable compound) contained in the curable composition. The curing method is not particularly limited and can be appropriately selected from known or commonly used methods, and examples thereof include a method of irradiation with active energy rays and/or heating. As the active energy rays, for example, any of infrared rays, visible light rays, ultraviolet rays, X-rays, electron beams, α-rays, β-rays, and γ-rays can be used. Among these, ultraviolet rays are preferable in terms of excellent handling.

A high-pressure mercury lamp, ultra-high pressure mercury lamp, carbon arc lamp, xenon lamp, metal halide lamp or the like is used as the light source. The duration of radiation varies depending on the type of light source, the distance between the light source and the surface to be coated, and other conditions, but is up to several tens of seconds. The illuminance is, for example, approximately 5 to 200 mW/cm$^2$. After irradiation with the active energy rays, heating (post-curing) may be performed as necessary to facilitate curing.

The curable composition is cured through the curing process described above, and a resin molded article can be obtained. After the curing process, the upper mold and the lower mold are opened, and the resin molded article can be removed from the mold.

Resin Molded Article

The resin molded article obtained by the production method according to an embodiment of the present invention can be preferably used as, for example, an optical component such as a lens, a prism, an LED, an organic EL element, a semiconductor laser, a transistor, a solar cell, a CCD image sensor, an optical waveguide, an optical fiber, and an alternative glass (for example, a display substrate, a hard disk substrate, or a polarizing film).

When producing, for example, a lens as the optical component, the lens may be obtained as a microlens array (for example, a structure having a shape in which a plurality of microlenses are arranged in rows and columns along the longitudinal and lateral directions). That is, the mold preferably includes a pattern shaped section corresponding to the shape of the microlens array.

Regarding the size of the optical component, if the optical component is a microlens array for example, one microlens is sized such that the diameter is approximately 0.01 to 100 mm for example, and the thickness is approximately 0.1 to 2.0 mm for example. The pitch width of the microlens array is, for example, from approximately 10 to 1000 μm.

Figure 3:
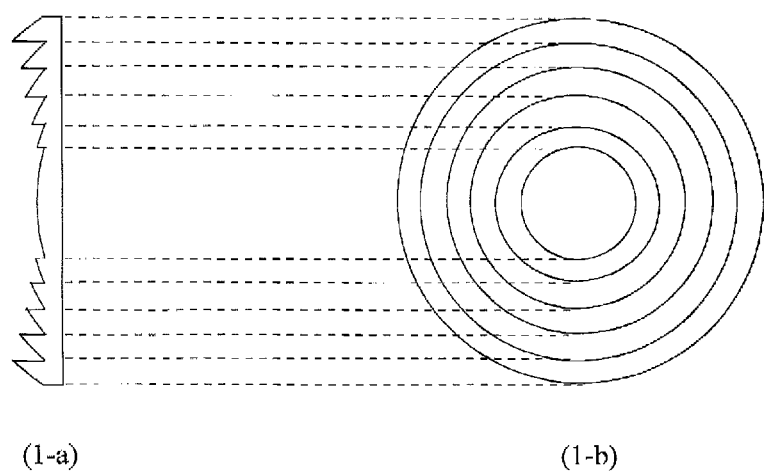
FIG. 3 is a schematic view illustrating an example of a Fresnel lens, where (1-a) is a cross-sectional view and (1-b) is a view seen from directly above.
Figure 4:
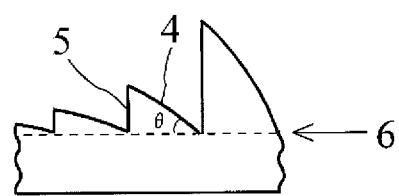
FIG. 4 is a schematic view illustrating a lens surface 4, a non-lens surface 5, and an angle θ formed by the lens surface 4 and a reference surface 6 in a Fresnel lens cross-section.

The optical component is particularly preferably a Fresnel lens array. Note that as illustrated in FIG. 3, the Fresnel lens is a lens formed of a plurality of prisms having a chevron cross-sectional shape, each prism being constituted by a lens surface 4 on a surface and a non-lens surface 5 opposite the lens surface. An angle θ formed between the lens surface 4 and a reference surface 6 becomes continuously smaller (or larger) toward the center, and in a case where only the lens surface 4 is continuous, one convex lens (or concave lens) would be formed (see FIG. 4). As illustrated in FIGS. 3 and 4, the mold for molding the Fresnel lens array has a fine concavo-convex shape, and therefore air bubbles are particularly likely to form during application of the curable composition. However, the method for producing a resin molded article according to an embodiment of the present invention can suppress the formation of air bubbles when the curable composition is applied to a mold for producing a resin molded article having a particularly fine concavo-convex shape such as a Fresnel lens array.

The repeating interval (distance between the topmost parts of convex portions or between the deepest parts of the concave portions, or in other words, the pitch width of the prism shape) in the Fresnel lens array is not particularly limited, but is preferably 0.5 mm or less, more preferably 0.2 mm or less, and even more preferably 0.1 mm or less. Note that the lower limit is, for example, 0.05 mm. The narrower the repeating interval, the prevention of air bubble formation becomes more difficult, but according to the method for producing a resin molded article according to an embodiment of the present invention, the formation of air bubbles can be suppressed even when a curable composition is applied to a mold having such a repeating interval.

In the Fresnel lens, the sharpness (convex portion tip R or concave portion valley R, that is, the acuity of the peak angle and cutting angle) is not particularly limited, but is preferably R 0.01 mm or less, more preferably R 0.005 mm or less, and even more preferably R 0.001 mm or less. Note that the lower limit is, for example, 0.0005 mm. As the R becomes smaller, the prevention of air bubble formation becomes more difficult, but according to the method for producing a resin molded article according to an embodiment of the present invention, the formation of air bubbles can be suppressed even when a curable composition is applied to a mold corresponding to such a sharpness.

The height interval (height difference between the topmost part of the convex portion and the deepest part of the concave portion) in the Fresnel lens array is not particularly limited, but is preferably 0.05 mm or greater, more preferably 0.5 mm or greater, and even more preferably 5 mm or greater. The upper limit is, for example, 10 mm. As the height interval becomes higher, the prevention of air bubble formation becomes more difficult, but according to the method for producing a resin molded article according to an embodiment of the present invention, the formation of air bubbles can be suppressed even when a curable composition is applied to a mold corresponding to such a height interval.

EXAMPLES

Hereinafter, the embodiments of the present invention are described in more detail based on examples, but the embodiments of the present invention are not limited by these examples.

Production Example 1

50 parts by weight of product under the trade name "X-32-3094-2" (available from Shin-Etsu Chemical Co., Ltd.), 50 parts by weight of product under the trade name "KE-1606" (available from Shin-Etsu Chemical Co., Ltd.), 5 parts by weight of product under the trade name "CX-32-3094-2" (available from Shin-Etsu Chemical Co., Ltd.), and 5 parts by weight of product under the trade name "CAT-RG" (available from Shin-Etsu Chemical Co., Ltd.) were mixed and stirred to prepare a resin composition. Next, a Teflon spacer measuring 40 mm long×20 mm wide×1.0 mm thick was fabricated and sandwiched between slide glasses (trade name "S2111", available from Matsunami Glass Ind., Ltd.) that had been subjected to a mold release treatment (dipped in a product under the trade name "Optool HD1000" available from Daikin Industries, Ltd., and left in a fume hood for 24 hours). Next, the resin composition obtained above was injected into the crevices, and then left to stand for 2 hours at room temperature, after which the resin composition was cured by heating for 30 minutes in an oven at 150° C., and thereby a silicone mold (thickness: 1.0 mm) having a pattern shaped section for producing a Fresnel lens array (repeating interval: 0.2 mm, sharpness: R 0.005 mm, height interval: 0.2 mm) as illustrated in FIG. 3 was produced.

Example 1

A curable composition (trade name "CELVENUS OUH106"; contact angle on a silicone mold described below: 28°; available from Daicel Corporation) was applied to the silicone mold obtained in Production Example 1 above using, as a coater, an airbrush (trade name "Airbrush Kit EA121DF"; coating nozzle diameter: 0.2 mm; available from Esco Co., Ltd.) at a distance from the nozzle to the silicone mold of 50 mm, and at a discharge speed of 5 mL/min and an application amount of 5+/−0.1 g (it was visually confirmed that a coating film of the curable composition was formed over the entire pattern shape). Note that the particle size of the curable composition when contacting the silicone mold was 0.2 mm or less.

After application, the number of air bubbles in the curable composition applied on the pattern shape of the silicone mold was visually confirmed, and the number of air bubbles was approximately 20.

Example 2

A curable composition was applied in the same manner as in Example 1 with the exception that an ultrasonic spraying device (trade name "40K50ST" (acoating nozzle diameter: 0.08 mm), available from Sonear Inc.) was used as the coater, and the discharge speed was set to 50 mL/min. Note that the particle size of the curable composition when contacting the silicone mold was 0.08 mm or less.

After application, the number of air bubbles in the curable composition applied on the pattern shape of the silicone mold was visually confirmed, and the number of air bubbles was approximately 20.

Example 3

A curable composition was applied in the same manner as in Example 1 with the exception that an air spray nozzle (coating nozzle diameter: 0.40 mm) was used as the coater, and the discharge speed was set to 3 mL/min. Note that the particle size of the curable composition when contacting the silicone mold was 0.45 mm or less.

After application, the number of air bubbles in the curable composition applied on the pattern shape of the silicone mold was visually confirmed, and the number of air bubbles was 10 or less.

Comparative Example 1

A curable composition was applied in the same manner as in Example 1 with the exception that syringe having a coating nozzle diameter of 1 mm or greater was used as the coater, and the discharge speed was set to approximately 60 mL/min.

After application, the number of air bubbles in the curable composition applied on the pattern shape of the silicone mold was visually confirmed, and the number of air bubbles was approximately 1000. Note that the particle size of the curable composition when contacting the silicone mold was 1 mm or greater.

To summarize the above, configurations of the embodiments of the present invention and variations thereof are described below.

[1] A method for producing a resin molded article which is a method for producing a resin molded article through imprint molding, the method including: one or more curable composition application processes from the following (1) to (4) in which a curable composition having a contact angle of 50° or less on a mold having a pattern shaped section is applied to a portion of the mold uncoated with the curable composition; and a curing process in which the curable composition applied to the mold is cured to obtain a resin molded article;

(1) a curable composition application process including a microparticle application step in which the curable composition is applied such that a particle size of microparticles of the curable composition when adhering to the mold is 0.5 mm or less;

(2) a curable composition application process including: a conductive substrate coating step in which a conductive substrate is coated with the curable composition; and a voltage application coating step in which a curable composition coated surface of the conductive substrate and a surface of the mold having the pattern shaped section are arranged so as to face each other, and voltage is applied between the conductive substrate and the mold to cause the curable composition applied onto the conductive substrate to contact the portion of the mold uncoated with the curable composition and be applied thereto;

(3) a curable composition application process in which the curable composition is applied to the portion of the mold uncoated with the curable composition, the mold having a pattern shaped section that has been subjected to a wettability improvement treatment on a surface;

(4) a curable composition application process including a heat application step in which the curable composition having a temperature that is 3 to 7° C. higher than a surface temperature of the mold having the pattern shaped section is applied to a portion of the mold that is uncoated with the curable composition and has a surface temperature at the pattern shaped section of from 35 to 55° C.

[2] The method for producing a resin molded article according to [1], the method including the curable composition application process (1), wherein, in the microparticle application step, the curable composition is applied such that an aspect ratio of the microparticles of the curable composition when adhering to the mold is 0.1 or greater.

[3] The method for producing a resin molded article according to [1] or [2], the method including the curable composition application process (1), wherein application in the microparticle application step is implemented by spray coating.

[4] The method for producing a resin molded article according to any one of [1] to [3], the method including the curable composition application process (1), wherein the curable composition application process (1) includes, after the microparticle application step, applying the curable composition to the mold such that the particle size of the curable composition when adhering to the curable composition applied to the mold exceeds 0.1 mm.

[5] The method for producing a resin molded article according to any one of [1] to [4], the method including the curable composition application process (2), wherein the curable composition application process (2) includes, after the voltage application coating step, applying the curable composition to the mold at an application speed of 100 mL/min or greater.

[6] The method for producing a resin molded article according to any one of [1] to [5], the method including the curable composition application process (3), wherein the wettability improvement treatment is one or more treatments selected from the group consisting of a plasma discharge treatment, a corona discharge treatment, an ozone exposure treatment, and an excimer treatment.

[7] The method for producing a resin molded article according to [6], wherein the plasma discharge treatment or the corona discharge treatment is a discharge treatment with a discharge amount of 50 W·min/m$^2$ or greater.

[8] The method for producing a resin molded article according to any one of [1] to [7], further including, after one or more of the curable composition application processes of (1) to (4), a mold closing process in which the mold coated with the curable composition, obtained through the one or more of the curable composition application processes of (1) to (4), is superimposed with another mold to which the curable composition was applied through the one or more of the curable composition application processes of (1) to (4), such that the curable compositions are in mutual contact.

[9] The method for producing a resin molded article according to any one of [1] to [8], wherein the curable composition contains an epoxy compound.

[10] The method for producing a resin molded article according to any one of [1] to [10], wherein the method includes, after the curable composition application process, a defoaming process through reduced pressure.

[11] The method for producing a resin molded article according to any one of [1] to [10], wherein the pattern shape of the mold is a concavo-convex shape, and a difference in height between a bottommost part of a concave portion and a topmost part of a convex portion is 0.05 mm or greater.

[12] The method for producing a resin molded article according to any one of [1] to [11], wherein the resin molded article is a microlens array.

[13] A method for producing an optical component that uses a resin molded article obtained by the method for producing a resin molded article described in any one of [1] to [12].

INDUSTRIAL APPLICABILITY

The resin molded article obtained by the production method according to an embodiment of the present invention can be preferably used as, for example, an optical component such as a lens, a prism, an LED, an organic EL element, a semiconductor laser, a transistor, a solar cell, a CCD image sensor, an optical waveguide, an optical fiber, and an alternative glass (for example, a display substrate, a hard disk substrate, or a polarizing film).

REFERENCE SIGNS LIST

S1 Curable composition application process
S2 Defoaming process
S3 Mold closing process
S4 Pressing process
S5 Curing process

The invention claimed is:

1. A method for producing a resin molded article which is a method for producing a resin molded article through imprint molding, the method comprising:
one or more curable composition application processes from the following (1) to (4) in which a curable composition having a contact angle of 50° or less on a mold having a pattern shaped section is applied to a portion of the mold uncoated with the curable composition; and
a curing process in which the curable composition applied to the mold is cured to obtain a resin molded article;
(1) a curable composition application process comprising a microparticle application step in which the curable composition is applied such that a particle size of the curable composition in the form of microparticles when adhering to the mold is 0.001 to 0.05 mm, and
after the microparticle application step, applying the curable composition to the mold such that the particle size of the curable composition when adhering to the curable composition applied to the mold exceeds 0.1 mm;
(2) a curable composition application process comprising:
a conductive substrate coating step in which a conductive substrate is coated with the curable composition; and a voltage application coating step in which a curable composition coated surface of the conductive substrate and a surface of the mold having the pattern shaped section are arranged so as to face each other, and voltage is applied between the conductive substrate and the mold to cause the curable composition applied onto the conductive substrate to contact the portion of the mold uncoated with the curable composition and be applied thereto,
after the voltage application coating step, applying the curable composition to the mold at an application speed of 100 ml/min or greater;
(3) a curable composition application process in which the curable composition is applied to the portion of the mold uncoated with the curable composition, the mold having a pattern shaped section that has been subjected to a wettability improvement treatment on a surface, wherein the pattern shape of the mold is a concavo-convex shape, and a difference in height between a bottommost part of a concave portion and a topmost part of a convex portion is 0.5 mm or greater, and wherein the mold repeating interval is 0.2 mm or less;
(4) a curable composition application process comprising a heat application step in which the curable composition having a temperature that is 4 to 6° C. higher than a surface temperature of the mold having the pattern shaped section is applied to a portion of the mold that is uncoated with the curable composition and has a surface temperature at the pattern shaped section of from 40 to 50° C.

2. The method for producing a resin molded article according to claim 1, the method comprising the curable composition application process (1), wherein, in the microparticle application step, the curable composition is applied such that an aspect ratio of the microparticles of the curable composition when adhering to the mold is 0.1 or greater.

3. The method for producing a resin molded article according to claim 1, the method comprising the curable composition application process (1), wherein application in the microparticle application step is implemented by spray coating.

4. The method for producing a resin molded article according to claim 1, the method comprising the curable composition application process (3), wherein the wettability improvement treatment is one or more treatments selected from the group consisting of a plasma discharge treatment, a corona discharge treatment, an ozone exposure treatment, and an excimer treatment.

5. The method for producing a resin molded article according to claim 4, wherein the plasma discharge treatment or the corona discharge treatment is a discharge treatment with a discharge amount of 50 W·min/m$^2$ or greater.

6. The method for producing a resin molded article according to claim 1, further comprising, after one or more of the curable composition application processes of (1) to (4), a mold closing process in which the mold coated with the curable composition, obtained through the one or more of the curable composition application processes of (1) to (4), is superimposed with another mold to which the curable composition was applied through the one or more of the curable composition application processes of (1) to (4), such that the curable compositions are in mutual contact.

7. The method for producing a resin molded article according to claim 1, wherein the curable composition contains an epoxy compound.

8. The method for producing a resin molded article according to claim 7, wherein the epoxy compound comprises a compound having an aliphatic epoxy group.

9. The method for producing a resin molded article according to claim 7, wherein the content of the epoxy compound in the curable composition is from 10 to 95 wt. %.

10. The method for producing a resin molded article according to claim 1, wherein the method comprises, after the curable composition application process, a defoaming process through reduced pressure.

11. The method for producing a resin molded article according to claim 1, wherein the pattern shape of the mold is a concavo-convex shape, and a difference in height between a bottommost part of a concave portion and a topmost part of a convex portion is 0.05 mm or greater.

12. The method for producing a resin molded article according to claim 1, wherein the resin molded article is a microlens array.

13. The method for producing a resin molded article according to claim 12, wherein the microlens array is a Fresnel lens array.

14. A method for producing an optical component including at least one of the following processes: defoaming process, mold closing process, and pressing process in addition to the method for producing a resin molded article according to claim 1.

15. The method for producing a resin molded article according to claim 1, the method comprising the curable composition application process (1), wherein, the curable composition is applied using a coater with a nozzle diameter of 0.5 mm.

16. The method for producing a resin molded article according to claim 1, the method comprising the curable composition application process (1), wherein, the application speed when applying the microparticles is not greater than 55 mL/min.

17. The method for producing a resin molded article according to claim 1, the method comprising the curable composition application process (1), wherein application in the microparticle application step is implemented by spray coating, air brush application, or ultrasonic application.

18. The method for producing a resin molded article according to claim 1, the method comprising the curable composition application process (4), wherein temperature of the curable composition upon heat application is from 44 to 56° C.

* * * * *